(12) United States Patent
Horan

(10) Patent No.: US 7,248,123 B2
(45) Date of Patent: Jul. 24, 2007

(54) PHASE LOCKED LOOP WITH FLOATING CAPACITOR BOOST CIRCUIT

(75) Inventor: John M. Horan, Cork (IE)

(73) Assignee: Ceva Services Limited, Dublin (IE)

( * ) Notice: Subject to any disclaimer, the term of this patent is extended or adjusted under 35 U.S.C. 154(b) by 149 days.

(21) Appl. No.: 11/121,910

(22) Filed: May 3, 2005

(65) Prior Publication Data

US 2006/0119439 A1  Jun. 8, 2006

Related U.S. Application Data

(60) Provisional application No. 60/633,233, filed on Dec. 2, 2004.

(51) Int. Cl.
*H03L 7/00* (2006.01)
*G05F 3/02* (2006.01)

(52) U.S. Cl. .............. 331/16; 331/17; 331/25; 331/1 A; 327/157; 327/536

(58) Field of Classification Search .......... 331/16, 331/17, 18, 25, 1 A; 327/148, 157, 536
See application file for complete search history.

(56) References Cited

U.S. PATENT DOCUMENTS

| 4,987,373 A | * | 1/1991 | Soo | 327/145 |
|---|---|---|---|---|
| 5,524,114 A | * | 6/1996 | Peng | 714/724 |
| 6,342,818 B1 | * | 1/2002 | Segawa et al. | 331/14 |
| 6,525,613 B2 | * | 2/2003 | Cyrusian | 331/17 |
| 6,828,654 B2 | * | 12/2004 | Tam et al. | 257/532 |

* cited by examiner

*Primary Examiner*—Robert Pascal
*Assistant Examiner*—Ryan Johnson
(74) *Attorney, Agent, or Firm*—Blakely, Sokoloff, Taylor & Zafman LLP

(57) ABSTRACT

Charge from a charge pump of a PLL is dumped to a loop filter of the PLL. The dumped charge is temporarily stored in a capacitor, between the charge pump and the loop filter. A voltage of the capacitor is shifted, while temporarily storing the dumped charge. Other embodiments are also described and claimed.

18 Claims, 3 Drawing Sheets

PHASE LOCKED LOOP WITH FLOATING CAPACITOR BOOST CIRCUIT

This application claims the benefit of the earlier filing date of U.S. Provisional Application No. 60/633,233, filed Dec. 2, 2004, entitled "Addition of a Floating Capacitor to a PLL".

BACKGROUND

Phased locked loop circuits (PLLs) are typically used whenever a periodic signal is to be generated whose frequency is an accurate multiple of the frequency of a very stable and low noise reference signal. A PLL is also used where the phase of an output signal has to track the phase of the reference signal. Applications include the generation of local oscillator signals in radio receivers and transmitters, as well as in clock recovery of digital communication systems.

The PLL is a closed loop feedback control system that continuously tries to reduce the error between the frequency or phase of its output signal and that of the reference. A typical PLL has what is referred to as a loop filter that connects a phase detector to a voltage controlled oscillator (VCO). The phase detector responds to the phase error between the reference and a feedback signal derived from the output, by making adjustments to a voltage signal in proportion to the phase error. Rather than directly applying the voltage signal to the input of the VCO, however, the signal is conditioned by the filter to produce the control voltage that adjusts the output frequency of the VCO. The filter is designed to help maintain the control loop stable, so that the loop does not enter an oscillatory condition. The filter may be viewed as smoothing out the input voltage to the VCO. The input voltage to the VCO adjusts the output frequency until, for example, a reference clock edge and a feedback clock edge are aligned.

In a conventional PLL, the phase detector may be realized by a phase frequency detector (PFD) that detects the phase error between the reference and feedback signals, and produces voltage pulses the widths of which are proportional to the phase error. These pulses may then be converted to electrical current pulses by a charge pump. Charge is dumped directly from the charge pump to the filter.

BRIEF DESCRIPTION OF THE DRAWINGS

The embodiments of the invention are illustrated by way of example and not by way of limitation in the figures of the accompanying drawings in which like references indicate similar elements. It should be noted that references to "an" embodiment of the invention in this disclosure are not necessarily to the same embodiment, and they mean at least one.

DETAILED DESCRIPTION

According to an embodiment of the invention, a conventional PLL may be modified such that the charge that is produced by the charge pump is temporarily stored on a "floating" capacitor (also referred to as a floatable capacitor), before being redistributed to the PLL loop filter. During this redistribution process, the capacitor voltages are shifted, to drive an elevated filter voltage. This increased voltage offsets the reduced voltage range available in advanced, complementary metal oxide semiconductor (CMOS) integrated circuit fabrication processes, where the power supply may be less than one and one-half volts (V), and often even less than one volt.

Figure 1:
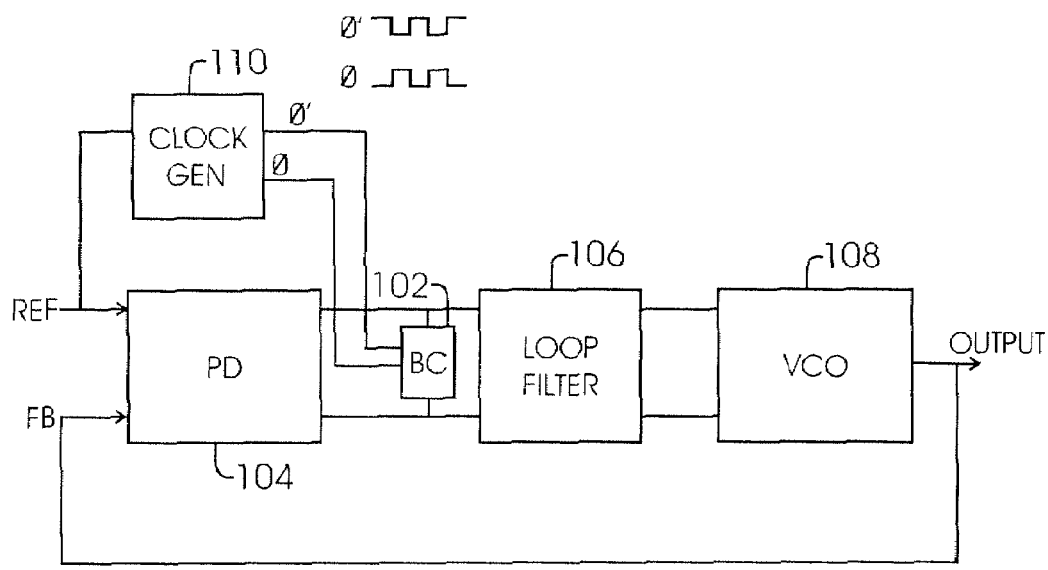
FIG. 1 is a simplified block diagram of a PLL with a floating capacitor boost circuit, according to an embodiment of the invention.

FIG. 1 shows a simplified schematic diagram of an embodiment of the invention. A PLL circuit is shown that has a voltage controlled oscillator (VCO) 108 that has an input control node coupled to an output of a loop filter 106. A phase detector (PD) 104 has an output that is coupled to the input of the VCO, via the loop filter 106, so that charge is dumped onto an input control node of the VCO 108, and the input control node voltage is filtered (e.g., low pass filtering). A boost circuit (BC) 102 is coupled between the PD 104 and the loop filter 106, to boost the input control node voltage. In this embodiment of the invention, the BC 102 is controlled by a pair of non-overlapping clock signals Ø and Ø' from a clock generator 110. These clock signals are derived, in this embodiment, from a reference signal (REF) that is an input to the PD 104. The other input to the PD 104 is a feedback signal (FB) derived from the output of the VCO 108. Note that FIG. 1 shows the basic building blocks of a PLL, without, for example, input and feedback frequency dividers.

The boost circuit 102 contains switch circuitry and a floatable capacitor. The switch circuitry has at least the following purposes. First, it alternatively couples the floatable capacitor to the output of the PD 104 in a first state, and to an input of the loop filter 106 in a second state. Second, the switch circuitry alternatively couples a voltage in series with the floatable capacitor in the second state, and removes this voltage in the first state. The switch circuitry may be controlled by the non-overlapping clock signals Ø and Ø', which are adjusted from a timing standpoint relative to the periodic updates at the output of the PD 104 so that the input voltage to the loop filter 106 is boosted during normal operation of the PLL.

Figure 2:
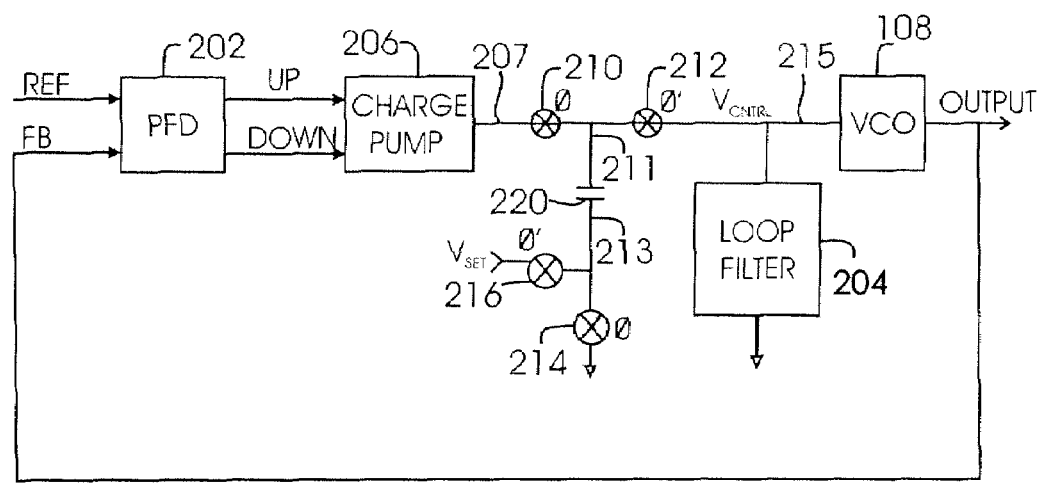
FIG. 2 is a simplified circuit schematic of a PLL, showing a preferred implementation of the boost circuit.

FIG. 2 shows another embodiment of the invention, as a PLL that has a preferred version of the boost circuit 102. A phase frequency detector (PED) 202 detects the phase error between its input edges (REE and EB), and produces voltage pulses whose widths are proportional to the phase error. In this case, there are two output voltage pulses, Up and Down. These pulses are converted to electrical current pulses by a charge pump (CP) 206. The electrical current pulses are then conditioned by, in this example, a single port loop filter 204 that is referenced only to power supply return (in this case, ground). An alternative is a two port filter; yet another is an active filter that operates off the same power supply as one used by the charge pump or the VCO. The filtered or conditioned pulses produce a voltage $V_{CNTRL}$ at an input control node 215 of the VCO 108. This control voltage adjusts the output frequency of the VCO, until the reference edge (REF) and the feedback dock edge (FB) are aligned.

A first component that is impacted by a reduced power supply voltage is VCO 108. For example, at supply voltages on the order of approximately one volt, the useful control voltage range (at the input of the VCO) may be only a free hundred millivolts. This can be appreciated based on the following example. First, a one volt supply may have a −10 percent lower limit. This reduces the available voltage range to 0.9 V. Second, with the lower limit, the charge pump 206 may only be able to effectively operate to within 100 mV of this value, leaving 0.8 V of useful control voltage. Finally, a VCO that is implemented with an N-channel metal oxide semiconductor field effect transistor (MOS FET) performing the task of a voltage controlled resistor will not function well near its threshold voltage. Accordingly, this removes another 0.4 V from the useful voltage control range, leaving only 400 mV for the actual available control voltage range. With this control voltage range, it becomes very difficult to target and maintain a particular VCO frequency constant across a large number of production specimens of the PLL circuit as fabrication process parameters and ambient temperature vary. If the control voltage is centered at a nominal temperature and fabrication process corner, there will only be 200 mV to compensate for the extremes of temperature and fabrication process variation.

Figure 3:
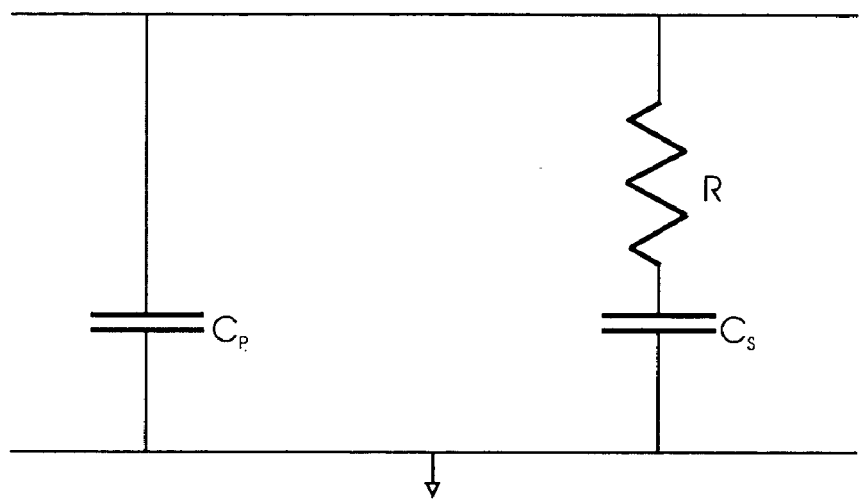
FIG. 3 shows a conventional PLL loop filter with parallel capacitors and a resistor.

Another challenge that is presented by a low supply voltage is the inability to use thick oxide MOS FET devices which are available in modern fabrication processes, in the loop filter 206. Thick oxide MOS FET devices are suitable for use as capacitors (such as the parallel capacitor $C_P$ for the example, second order loop filter shown in FIG. 3). They present relatively low leakage current as compared to thin oxide devices, and thus help better maintain a desired, constant VCO frequency between consecutive reference clock edges. However, they need a higher operating voltage to provide a predictable capacitance.

FIG. 2 shows an example of how the boost circuit 102 may be implemented, by adding a floatable capacitor 220 between an output node 207 of the PD 104 (which in this example only, happens to be the output node of the charge pump 206) and the input node 215 of the VCO 108 (which, in this example only, also happens to be the input node of the loop filter 204). The switch circuitry in this example includes a switch 210 that couples the output node of the charge pump 206 to a terminal 211 of the capacitor. Another switch 212 couples the terminal 211 to the input node of the loop filter 204. Yet another switch 214 couples another terminal 213 of the capacitor to a constant voltage node (here, power supply return, and in this case ground). Finally, switch 216 couples the terminal 213 to another constant voltage node ($V_{SET}$).

Switches 210 and 214 are opened and closed in this example simultaneously, under control of a clock signal Ø, while switches 212 and 216 may be opened and closed simultaneously under another clock signal Ø' (where Ø and Ø' are non-overlapping). Such a boost circuit performs at least two purposes. First, it captures the charge that is dumped from the charge pump 206. Although the charge here is said to be "produced by" or "dumped from" the charge pump, the charge pump can also take charge away from the capacitor 220. Thus, rather than having to say both "produced/dumped" and "taken away", the charge that is dumped/produced is said to be either "positive" or "negative". This capture of the charge being dumped is enabled by turning On switches 210, 214, while maintaining Off switches 212, 216. This action connects the capacitor 220 directly to the output of the charge pump 206 and to power supply return (in this case, ground) so that the capacitor 220 captures positive or negative charge as produced by the charge pump 206. This leaves a certain voltage across the capacitor terminals 211, 213 at the end of the time interval during which the clock signal Ø is asserted.

The next operation is to redistribute the charge that has been obtained from the charge pump, to the loop filter 204. This is completed by opening the switches 210, 214, thus temporarily floating the capacitor 220 (during which time the capacitor is expected to maintain its voltage, DeltaV), and then closing switches 212, 216. This latter action shifts the voltage at the terminals of the capacitor, by the voltage Vset. This is because the voltage across the terminals of the capacitor remains essentially fixed while the capacitor is floating, since no appreciable amount charge leaves the capacitor. Moving, in this example, the terminal 213 from ground to a positive Vset results in moving the terminal 211 to Vset+DeltaV (where DeltaV was the positive voltage that resulted from the charge being dumped during the interval where clock signal Ø was asserted).

Since the terminal 211 becomes connected (via a low impedance path through switch 212) to the input node 215 of the loop filter 204 and VCO 108, the action of the switch circuitry described above results in a higher voltage feed for the filter 206 and the VCO 208. This may help overcome the two problems described above that are associated with reduced power supply voltages. First, the VCO 108 now has an increased effective range. For example, if Vset is equal to the threshold voltage ($V_t$) of an N-channel MOS device that is used as a control resistor (not shown in FIG. 2, but see MOS FETs 404, 408 in FIG. 4) in the VCO 108, then the 400 mV (if we consider the example numbers given above) normally lost from the available range, is recouped and used to restore much, if not all, of the full control range of 800 mV. Also, if Vset is equal to the $V_t$ of thick oxide MOS FET devices, as opposed to thin oxide devices, used in the loop filter 204 (e.g., $C_P$ in FIG. 3 and in FIG. 4), then the voltage across the loop filter 204 depicted in FIG. 2 is level shifted upwards to a value where these thick oxide capacitors are providing a predictable capacitance.

Figure 4:
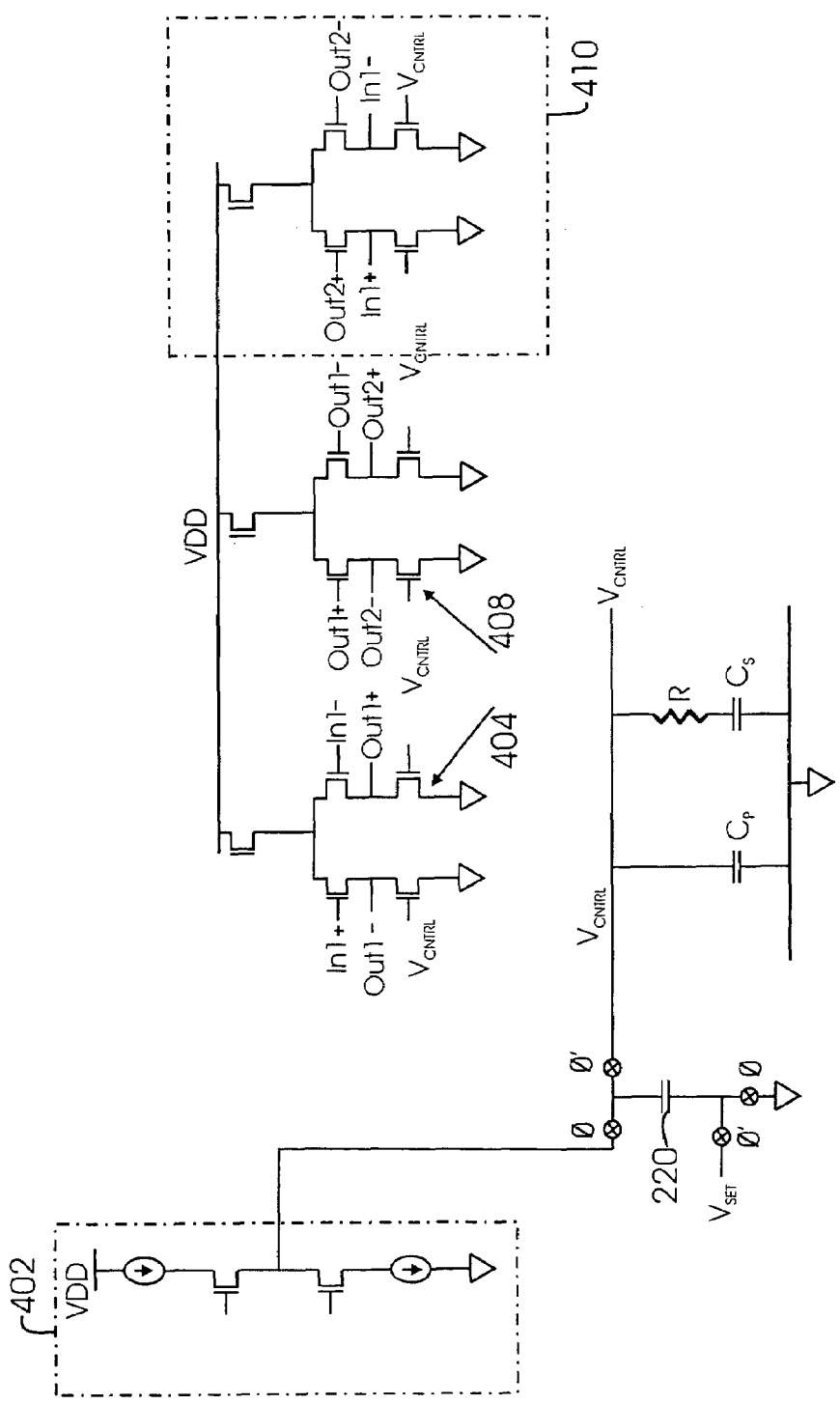
FIG. 4 is a more detailed schematic of portions of a PLL, according to an embodiment of the invention.

FIG. 4 shows a more detailed view of an output stage of the charge pump 206, the boost circuitry (according to the preferred embodiment of FIG. 2), and a preferred implementation of the loop filter 204 and a front end to the VCO 108. This detailed schematic illustrates an example of a simplified charge pump output 402 at a power supply voltage VDD of either 1 V or 3 V, for example, N-MOS FETs 404, 408 that are used as the controlled resistor in the front end of the VCO 108, a thick oxide device for a parallel capacitor $C_P$ and another for the series capacitor $C_s$ in the loop filter 204, and a simplified VCO delay unit 410 (running off power supply VDD which may be at 1 V), in a MOS fabrication process. The floatable capacitor 220 may be as small as, for example, 40 femtoFarads, and may be obtained by exploiting the capacitance that is available between the metal layers of the MOS fabrication process. Both terminals of a capacitor that has been manufactured in this manner are thus floatable in this embodiment, since each terminal can be electrically isolated by the switch circuitry (e.g., switches 210-216). The capacitance should be selected in view of a number of factors, including the charge pump output current range, the charge pump frequency of update, and the input impedance of the loop filter.

One or more of the embodiments described above for the PLL may ameliorate the problems associated with a reduction of power supply voltage (e.g., VDD) to relatively low levels, such as less than 1.5 V and preferably around 1 V and lower, in advanced MOS fabrication technologies. An example PLL was described with a mechanism that dumps charge onto an input control node of the VCO and/or an input node of the loop filter, in response to detecting a phase difference between a reference signal and a feedback signal derived from an output of the VCO. Circuitry for boosting the input node voltage was also described. A method for operating a PLL circuit is thus contemplated, where instead of dumping charge directly from a charge pump to a loop filter of the PLL, the dumped charge is temporarily stored in a capacitor between the charge pump and the loop filter, and a voltage of the capacitor is shifted while temporarily storing the dumped charge.

The embodiments of the PLL described above may be implemented in a complementary metal oxide semiconductor (CMOS) fabrication process. The passive capacitors would be MOS devices while the switching circuits would include CMOS transmission gates. Other microelectronic fabrication technologies may also be used to implement the PLL.

The PLL designs described above may be embodied in an electronic design automation/computer aided design file format that is popular in the industry for transferring or archiving a mask drawing and layout design of an integrated circuit. An example is a GDS file that describes the physical layout and identifies the components of the PLL and its boost circuit for a particular fabrication technology. The GDS file may be stored in a machine-readable medium, such as a CDROM or a distributed medium such as an Internet transfer. Such a medium would have stored therein instructions which, when executed by a processor, describe the PLL circuit design and its loop filter according to any of the embodiments mentioned above.

The invention is not limited to the specific embodiments described above. For instance, although Vset was stated to be equal to the threshold voltage of either a thick oxide device in a loop filter, or an N-MOS device used as a controlled resistor in the VCO, an alternative is to make Vset be greater than the $V_t$ of a transistor device, to further boost the input node voltage of the filter and/or the VCO. In addition, although the preferred embodiment switches a terminal of a floatable capacitor between Vset and ground (to achieve the boost in the input node voltage), other switching circuits that couple the Vset voltage in series with the capacitor (to effectively boost the input control node voltage) are possible. Accordingly, other embodiments are within the scope of the claims.

What is claimed is:

1. A method for operating a phase locked loop (PLL) circuit, comprising:
   dumping charge from a charge pump to a loop filter of the PLL;
   temporarily storing the dumped charge in a capacitor between the charge pump and the loop filter; and
   shifting a voltage of the capacitor while temporarily storing the dumped charge, by floating the capacitor.

2. The method of claim 1 further comprising operating the charge pump at a power supply voltage of about one and a half (1.5) Volts or less.

3. The method of claim 1 further comprising operating a voltage controlled oscillator of the PLL at a power supply voltage of about one and a half (1.5) Volts or less.

4. The method of claim 3 wherein the voltage of the capacitor is shifted by no more than about one half (½) Volt.

5. A phase locked loop (PLL) circuit, comprising:
   a voltage controlled oscillator (VCO);
   a phase detector having a charge pump with an output coupled to an input of the VCO;
   a loop filter coupled between the phase detector and the VCO; and
   a boost circuit coupled between the phase detector and the VCO input, the boost circuit having switch circuitry to (a) alternatively couple a capacitor to the charge pump output in a first state and to the VCO input in a second state, and (b) alternatively couple a voltage in series with the capacitor in the second state and remove the voltage in the first state.

6. The PLL circuit of claim 5 wherein the phase detector comprises:
   a phase-frequency detector (PFD) to compare a reference signal with a feedback signal derived from an output of the VCO wherein the charge pump is controlled by an output of the PFD.

7. The PLL circuit of claim 6 wherein the switch circuitry comprises:
   a first switch that couples the output of the charge pump to a terminal of the capacitor;
   a second switch that couples said terminal of the capacitor to the VCO input;
   a third switch that couples another terminal of the capacitor to a first constant voltage node; and
   a fourth switch that couples said another terminal of the capacitor to a second constant voltage node.

8. The PLL circuit of claim 7 wherein the first constant voltage node is a power supply return node.

9. The PLL circuit of claim 7 wherein (a) the first and third switches and (b) the second and fourth switches, are controlled by non-overlapping clock signals.

10. The PLL circuit of claim 7 wherein the second constant voltage node is set at less than about one half (½) Volt.

11. The PLL circuit of claim 7 wherein the VCO is to operate at a power supply voltage of about one and a half (1.5) Volts or less, and the second constant voltage node is set at less than about one half (½) Volt.

12. The PLL circuit of claim 5 wherein the phase detector, loop filter, VCO, and boost circuit are integrated in a CMOS integrated circuit die and are to operate at a power supply voltage of about one and a half (1.5) Volts or less.

13. The PLL circuit of claim 7 wherein the phase detector, loop filter, VCO, and boost circuit are integrated in a MOS integrated circuit die that has thick oxide FET devices and thin oxide FET devices, the loop filter comprises a thick oxide FET device configured as a loop filter capacitor, and the second constant voltage node is set about equal to a threshold voltage of the thick oxide FET device in the loop filter capacitor.

14. The PLL circuit of claim 5 wherein the input of the VCO and the input of the loop filter are at the same node.

15. The PLL circuit of claim 14 wherein the phase detector comprises:
   a phase-frequency detector (PFD) to compare a reference signal with a feedback signal derived from an output of the VCO wherein the charge pump is controlled by an output of the PFD.

16. The PLL circuit of claim 15 wherein the switch circuitry comprises:
   a first switch that couples the output of the charge pump to a terminal of the capacitor;
   a second switch that couples said terminal of the capacitor to the VCO input;
   a third switch that couples another terminal of the capacitor to a first constant voltage node; and
   a fourth switch that couples said another terminal of the capacitor to a second constant voltage node.

17. A phase locked loop (PLL) circuit, comprising:
means for dumping charge onto an input control node of a voltage controlled oscillator (VCO) of the PLL in response to detecting a phase difference between a reference signal and a feedback signal derived from an output of the VCO; and
means for boosting the input control node voltage without using said dumping means.

18. The PLL circuit of claim 17 further comprising means for filtering the input control node voltage.

* * * * *